United States Patent [19]
Yamasaki

[11] Patent Number: 5,384,560
[45] Date of Patent: Jan. 24, 1995

[54] MAXIMUM LIKELIHOOD SEQUENCE METRIC CALCULATOR

[75] Inventor: Richard G. Yamasaki, Torrance, Calif.

[73] Assignee: Silicon Systems, Inc., Tustin, Calif.

[21] Appl. No.: 184,786

[22] Filed: Jan. 21, 1994

Related U.S. Application Data

[63] Continuation of Ser. No. 694,428, May 1, 1991, abandoned.

[51] Int. Cl.[6] .......... H03K 5/153; G05B 1/00
[52] U.S. Cl. .................. 340/146.2; 327/60; 327/62; 327/72
[58] Field of Search .......... 340/146.2; 307/351, 307/353, 358, 359

[56] References Cited

U.S. PATENT DOCUMENTS

| | | | |
|---|---|---|---|
| 3,508,158 | 4/1970 | Marchese | 307/358 |
| 4,710,746 | 12/1987 | Shimoda et al. | 340/347 DD |
| 4,755,960 | 7/1988 | Batson et al. | 340/146.2 |
| 4,991,134 | 2/1991 | Ivsin | 340/146.2 |
| 5,115,404 | 5/1992 | Lo et al. | 307/351 |

OTHER PUBLICATIONS

Jerald Graeme, "Getting inside a peak detector to make it do the job", Electronics, Nov. 14, 1974, p. 145.
Roger Wood, "Magnetic Megabits", IEEE Spectrum, May 1990, pp. 32–38.

Primary Examiner—Timothy P. Callahan
Assistant Examiner—Toan Tran
Attorney, Agent, or Firm—Hecker & Harriman

[57] ABSTRACT

A maximum likelihood sequence metric calculator for use in a sequence decoder for processing sequences of sampled values from a communication channel or recording device. The metric calculator can be used in a maximum likelihood decoder, where the sequence can be based upon a 2-state trellis. This would include duobinary, dicode, or partial response class IV signalling. The survivor metrics for the two states is proportional to the peak amplitude detected for that state. Thus, the peak amplitude for a state is stored by a peak detector, until an opposite polarity amplitude is detected to switch the trellis path to the opposite polarity state. The path switching threshold to a state is determined by the opposite polarity state's peak amplitude and the maximum likelihood threshold value. Since only the peak amplitude of the state is stored, unbounded metric absolute value growth is not a problem.

8 Claims, 6 Drawing Sheets

MAXIMUM LIKELIHOOD SEQUENCE METRIC CALCULATOR

This is a continuation of application Ser. No. 694,428 filed May 1, 1991, now abandoned.

BACKGROUND OF THE PRESENT INVENTION

1. FIELD OF THE INVENTION

This invention relates to the field of digital transmission through analog channels.

2. BACKGROUND ART

Communication of voice and data signals is often accomplished by converting analog signals to digital signals. These digital signals are then transmitted from a transmitting device to a receiving device, converted back to analog, if necessary, and communicated to a user. This digital transmission is often performed through analog channels. Digital information is transmitted in the form of a "symbol" representing a digital value. In some cases, adjacent symbols can overlap, resulting in a phenomenon known as intersymbol interference. This interference can corrupt a digital transmission, leading to errors in the receipt of the digital information.

In a magnetic recording channel, a method for decoding the binary symbol sequence that is outputted from the channel in its corrupted form is required. MLSE decoding has been employed in the past as an effective tool in pulse detectors for receiving and decoding digital transmissions that suffer from intersymbol interference. Because class IV partial response signaling for digital detection is especially suited for the magnetic recording channel, sampled amplitude detection can be applied for magnetic recording. To minimize the propagation of data errors, the signal is turned into a sequence of binary numbers and procedures for determining the maximum likelihood sequence in the presence of noise can be applied. With sequence detection, sequences of bits are detected and processed to minimize error.

Maximum likelihood sequence estimation (MLSE), in particular, the Viterbi algorithm, is used in improving the detection of symbol (pulse) sequences in the presence of noise and intersymbol interference. MLSE is described by G. D. Forney in "The Viterbi Algorithm," Proceedings of the IEEE, Vol. 61, No. 3, March, 1973, pp. 268-278, and by R. W. Wood, etc., in "Viterbi Detection of Class IV Partial Response on a Magnetic Recording Channel," IEEE transactions on communications, Vol. COM-34, No. 5, May, 1986, pp. 454-461.

One of the earliest references (Kobayashi, "Application of Probablistic Decoding to Digital Magnetic Recording Systems," IBM Journal of Research and Development, Vol. 15, No. 1, January 1971, pp. 64-74) to the use of the Viterbi algorithm on the intersymbol interference problem was related to Class IV Partial Response on the Magnetic Recording Channel. In essence, the algorithm provides an iterative method of determining the "best" route along the branches of a trellis. If, for each branch, a "metric" is calculated which corresponds to the logarithm of the probability of that branch, then the Viterbi algorithm can be used to determine the path which accumulates the highest log probability, i.e., the maximum likelihood sequence. In essence, given a received sequence $(a_n)$ where n is an integer time index, choose from among all possible transmitted sequences $(b_n)$ the one which is most likely to cause $(a_n)$ to be received, i.e., choose $(b_n)$ to maximize $P((a_n)|(b_n))$.

With the Viterbi algorithm, data is not decoded as soon as it is received. Instead, a sequence of data, having a predetermined coding depth, following the digit to be decoded is first collected. Then, by computing the path metrics, a limited number of possible messages are selected, each extending throughout the decoding depth far beyond the digit presently to be decoded, with one such survivor sequence ending in each of the data states. The correlation between each survivor sequence and the data actually received is computed for the entire decoding depth under consideration. The highest correlated of the survivor sequences is selected to be the sole survivor sequence. The earliest received digital digits within the decoding depth is then permanently decoded under the temporary assumption that the sole survivor sequence is the correct sequence.

Using partial response signalling allows a better handling of intersymbol interference and allows a more efficient utilization of the bandwidth of a given channel. In partial response systems, a controlled amount of intersymbol interference can be allowed. The partial response system is described by the polynomials $1+D$, $1-D$ and $(1-D^2)$, also called duobinary, dicode, and class-IV, respectively.

The MLSE problem is similar to the problem of finding the shortest route through a certain graph. The Viterbi algorithm arises as a natural recursive solution. This algorithm is often associated with a state diagram which can be illustrated by a trellis as shown in FIG. 1. In the two-state trellis of FIG. 1, each node represents a distinct state at a given time, and each branch represents a transition to some new state at the next instant of time. The trellis is such, that for every possible state sequence, there corresponds a unique path through the trellis, and vice versa. The shortest path segment between two states is called the survivor. For any time interval, there may be more than one survivor, and the shortest complete path must continue through one of these survivors. Thus, at any time K, it is required to remember only the number of survivors and their lengths. To arrive at time K+1, it is required only to extend all time K survivors by one time unit, compute the lengths of the extended path segments, and for each node $X_{K+1}$ select the shortest extended path segment terminating in $X_{K+1}$ as the corresponding time (K+1) survivor.

For the 2-state trellis shown in FIG. 1, the upper branches and nodes represent the (1) state path and the lower state branches and nodes represent the (−1) or (0) state path. The diagonal branches represent a path that changes state. The node metrics (the accumulated log likelihood) at time K are only a function of the node metrics at K−1 and the path metrics. They are given by:

$$M_K(-1) = \max[M_{K-1}(-1), M_{K-1}(1) - Y_K - V_T] \quad (1)$$

$$M_K(1) = \max[M_{K-1}(1), M_{K-1}(-1) + Y_K - V_T] \quad (2)$$

where
$M_K(-1) = (-1)$ metric value at t=K
$M_K(1) = (1)$ metric value at t=K
$Y_K$ = signal amplitude at t=K
$V_T$ = threshold amplitude for $Y_K$, the most likely value between a sequence pulse and no pulse. $V_T$ typically has a value of approximately $Y_K/2$.

$V_T$ is set to equal the most likely value between $Y_K$ and noise. $V_T$ could be set by the average peak values of $Y_K$ or by a predetermined or programmable value.

Thus, a change in state for equation (1) will occur if $M_{k-1}(1) - Y_K - V_T \geq M_{K-1}(-1)$, e.g., $M_K(-1) \neq M_{K-1}(-1)$. A change in state for equation (2) will occur if $M_{K-1}(-1) + Y_K - V_T > M_{K-1}(-1)$, e.g., $M_K(1) \neq M_{K-1}(1)$.

An algorithm is illustrated for a 4-state trellis covering five time units in FIGS. 2A and 2B. FIG. 2A shows the complete trellis, with each branch labeled with a length. In a real application, the lengths are functions of the received data. FIG. 2B shows five recursive steps by which the algorithm determines the shortest path from the initial to the final node. At each stage, only four or fewer survivors are shown, along with their lengths. It can be seen in FIG. 2 that for each time interval, each node outputs two separate path segments and the shortest such path segment is the one that "survives." Thus, by time interval five, the Viterbi algorithm has determined the shortest path.

Two prior art examples of applying the Viterbi algorithm for decoding magnetic recording channel outputs are U.S. Pat. No. 4,644,564 by *Dolivo et al.* and U.S. Pat. No. 4,087,787 by *Acampora*. *Dolivo et al.* disclose a method that uses two survivor sequences and the difference metric between the two metrics is processed. In *Dolivo et al.*, as each sample is received, the prior art patent recursively determines the new pair of survivor sequences and the new difference metric. *Dolivo et al.* is implemented in a digital format which at times is more accurate but suffers in terms of speed and requires more electronics to implement. Furthermore, resetting of the voltage signals does not occur automatically as is desired.

*Acampora* employs a Viterbi decoder that comprises a tap delay line and sample-and-hold circuits to perform the path metric operations including storing and updating the path metrics. The path metrics of *Acampora* can increase without bound with time. To prevent metric overflow, one metric is arbitrarily set to zero. The original value of that metric is first subtracted from all other metrics to preserve the integrity of the difference between the path metrics. A simpler and less arbitrary implementation is desired. Furthermore, these tap delay lines would need to be implemented by variable delays.

SUMMARY OF THE PRESENT INVENTION

A maximum likelihood sequence metric calculator is used in a sequence decoder for processing sequences of sampled values from a communication channel or recording device. The metric calculator can be used in a maximum likelihood decoder, where the sequence can be based upon a 2-state trellis. This includes duobinary, dicole, or partial response class IV signalling. The survivor metrics for the two states is proportional to the peak amplitude detected for that state. Thus, the peak amplitude for a state is stored by a peak detector, until an opposite polarity amplitude is detected to switch the trellis path to the opposite polarity state. The path switching threshold to a state is determined by the opposite polarity state's peak amplitude and the maximum likelihood threshold value. Since only the peak amplitude of the state is stored, unbounded metric absolute value growth is not a problem.

The sequence estimation performed by the maximum likelihood sequence metric calculator is based on the use of the Viterbi algorithm. The Viterbi metric calculator is built by using peak detectors which are able to signify a transition from one state to another by detecting a peak amplitude of the opposite polarity. For partial response signalling, the signal could exceed the (1) and (−1) signal levels and thus the wrong threshold would be stored by the peak detectors. However, this problem is solved by gating the peak detectors to detect peaks at the proper time or in an analog implementation by using sample and holds before the peak detectors. The sample and hold (S/H) holds the signal amplitude at the hold time when the signal is at its expected (1) or (−1) level. The peak detectors are then gated to peak detect only during the hold time. For partial response Class IV, the sample and holds are also used to demultiplex the interleaved Class IV data stream.

DETAILED DESCRIPTION OF THE PRESENT INVENTION

A maximum likelihood sequence metric calculator that is used in a sequence decoder for processing sequences of sampled values from a communication channel or recording device is described. In the following description, numerous specific details, such as signal type and algorithm type, etc., are described to provide a more thorough description of the present invention. It will be apparent, however, to one skilled in the art, that the present invention may be practiced without these specific details. In other instances, well known features have not been described in detail so as not to unnecessarily obscure the present invention.

It has been shown that using the Viterbi algorithm in a metric calculator can provide a technique for maximum likelihood reception in the presence of intersymbol interference, particularly in the situation of partial response. In digital transmission through analog channels, intersymbol interference is frequently encountered. Ideally, the samples $z_n$ equal the corresponding input sequence $a_n$, or some simple function thereof. In fact, however, the samples are perturbed both by noise and by neighboring inputs $a_n'$. The latter effect is called intersymbol interference.

Concerning partial response, class IV partial response has been shown to be particularly appropriate to the magnetic recording channel. The partial response signal emphasizes mid band frequencies and becomes relatively immune to noise and distortion at both low and high frequencies.

THEORY OF OPERATION

Figure 3:
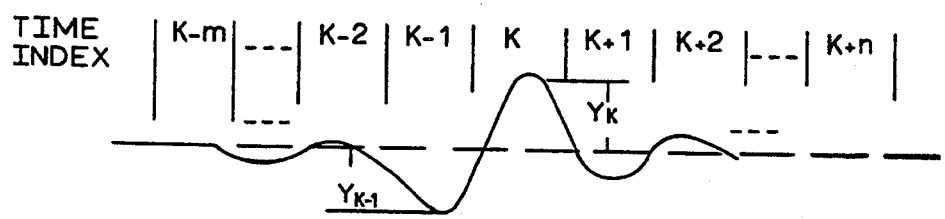
FIG. 3 is a typical signal waveform that can be implemented in the metric calculator of the present invention.
Figure 2A:
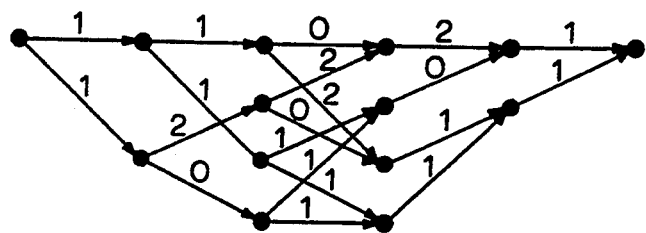
FIGS. 2A and 2B are diagrams that illustrate a shortest path sequence for a simple 4-state trellis.
Figure 2B:
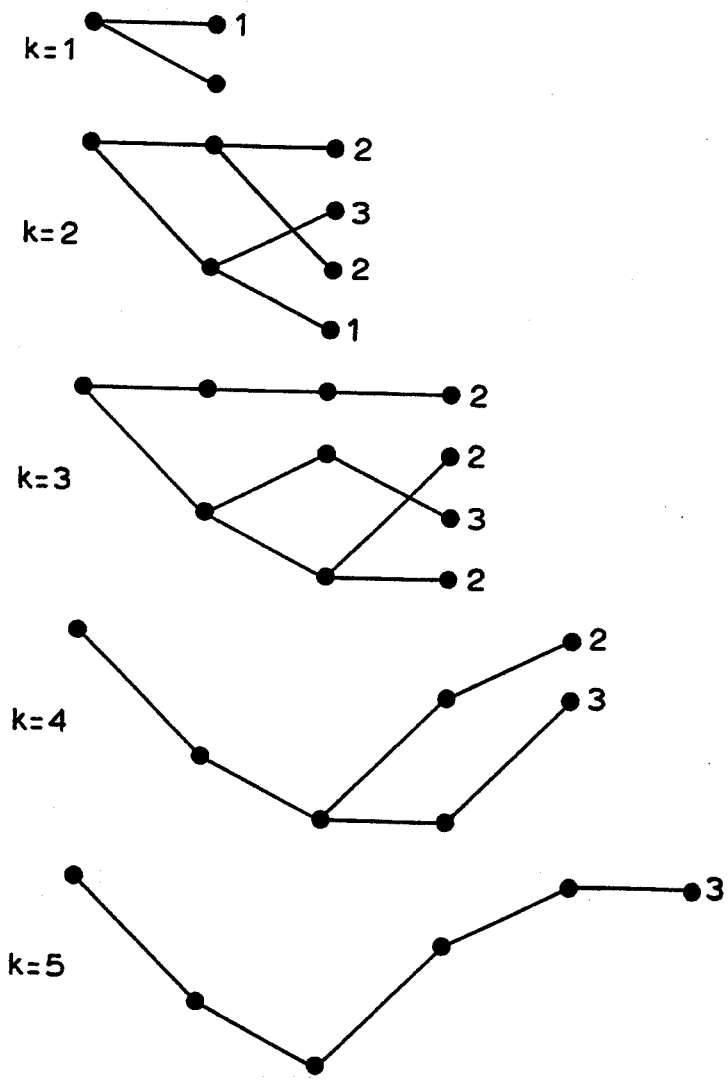

In FIG. 3, a typical signal waveform that can be implemented in the metric calculator of the present invention is illustrated. Note in the following discussion that:

$M_K(-1)$ is the metric value (the logarithm of the probability of the sequence) at $t=K$ on the $(-1)$ state path;

$M_K(1)$ is the metric value at $t=K$ on the $(1)$ state path;

$Y_K$ is the signal amplitude at $t=K$; and $V_T$ is the threshold value, the most likely value between a sequence pulse $(Y_k)$ and no pulse (noise).

Consider the waveform of FIG. 3 where a $(-)$ pulse occurs for time $t<K$ (where K is some random point in time) and a $(+)$ pulse occurs for $t>K$. Assume at $t=K-1$ the largest $(-)$ pulse $Y_{K-1}$, without the detection of a $(+)$ pulse occurs for $t<K-M$. (Detection is defined as the possible switching from one polarity state path to the other polarity state path). Then, $M_{K-1}(-1)$ increases because:

$$-Y_{K-1}-V_T+M_{K-2}(1)>M_{K-2}(-1) \quad (3)$$

then at $t=K-1$, since a $(-)$ pulse occurred, the $(1)$ metric does not change and $M_{K-1}(1)=M_{K-2}(1)$ and $$M_{K-1}(-1)=-Y_{K-1}-V_T+M_{K-1}(1) \quad (4)$$

It will be shown that the largest pulse before detection of an opposite polarity pulse determines the metric for that polarity state on that part of the path. Thus, $M_{K-1}(-1)$ is determined by (4) and not by $M_{K-m}(-1)$.

At $t=K$, the Viterbi trellis path transition from the $(-1)$ state to the $(1)$ state occurs if:
$M_K(1) \geq M_{K-1}(1)$ because $$Y_K - V_T + M_{K-1}(-1) \geq M_{K-1}(1) \quad (5)$$

$$Y_K - V_T \geq M_{K-1}(1) - M_{K-1}(-1) \quad (6)$$

from (4)

$$Y_K - V_T \geq M_{K-1}(1) + Y_{K-1} + V_T - M_{K-1}(1) \quad (7)$$

or $$Y_K - V_T \geq Y_{K-1} + V_T \quad (8)$$

and $$Y_K \geq Y_{K-1} + 2V_T \quad (9)$$

Thus, a $(+)$ threshold of $2V_T$ plus the largest previous $(-)$ amplitude is set for the $(+)$ signal. When the condition in (8) or (9) is met, sequence pulse is detected.

After the $(1)$ pulse at $t=K$, consider another $(1)$ pulse at $t=K+N$. At this point the trellis path has retained two paths since the last pulse at $t=K$. One path assumes that the $(1)$ pulse at $t=K$ is the correct bit of information detected and has made the transition to the $(1)$ state from $t=K-1$ to $t=K$. Since no pulses have occurred between times $t=K$ and $t=K+N$, this path has remained in the $(1)$ state. The second path retained assumes the supposed transition to the $(1)$ state at $t=K$ is based on an incorrect bit of information. Thus, the second path continues on the $(-1)$ state path waiting for another transition that is higher in amplitude compared to the $(1)$ pulse at $t=K$. If the $(1)$ pulse at $t=K+N$ is greater than the $(1)$ pulse at $t=K$, then the first path is disregarded, and the $(1)$ pulse at $t=K+N$ undergoes the analysis to determine if a switch to the $(1)$ state is to be made. A switch from the $(-1)$ state path would require:

$$M_{K-1}(-1)+Y_{K+N}-V_T \geq M_K(1) \quad (10)$$

where $$M_K(1)=M_{K-1}(-1)+Y_K-V_T$$

$$M_K(-1)=M_{K-1} \quad (-1)$$

then $$M_{K-1}(-1)+Y_{K+N}-V_T \geq M_{K-1}(-1)+Y_K-V_T \quad (11)$$

or $$Y_{K+N} \geq Y_K \quad (12)$$

Thus, a higher amplitude pulse at $t=K+N$ is required to change the state of the trellis path and signify the detection of a sequence pulse. Therefore, if the largest $(-1)$ pulse occurred at $t=K-M$, the $(-1)$ metric would have been:

$M_{K-1}(-1)=M_{K-M}(-1)$
and
$M_{K-1}(1)=M_{K-M}(1)$.

If the pulse polarities in FIG. 3 are reversed, and the largest $(+)$ pulse occurs at $t=K-1$, the path state will switch if:

$$Y_{K-1}-V_T+M_{K-1}(-1) \geq M_{K-1}(1) \quad (13)$$

and $$M_{K-1}(1)=Y_{K-1}V_T+M_{K-1}(-1) \quad (14)$$

Then at $t=K$, a switch to the $(-1)$ path occurs if $M_{K-1}(-1)$ increases because:

$$-Y_K-V_T+M_{K-1}(1) \geq M_{K-1}(-15)$$

or $$Y_K-V_T \geq M_{K-1}(-1)-M_{K-1}(16)$$

and $$-Y_K-V_T \geq M_{K-1}(-1)-Y_{K-1}+V_T-M_{K-1}(-1) \quad (17)$$

thus, $$-Y_K-V_T \geq -Y_{K-1}+V_T \quad (18)$$

and $$-Y_K-Y_{K-1}+2V_T \quad (19)$$

Except for the signal's polarity, equation (19) is the same as equation (9). The following characteristics are observed about the Viterbi trellis path:

(A) The correct trellis path is determined by the highest of the same polarity pulses (pulse sequence without the detection of an opposite polarity pulse) determines the correct path.

(B) The threshold for a state path polarity switch is determined by the highest previous opposite polarity amplitude minus two times the threshold value.

(C) Since only the highest input signal amplitude is required to determine the correct path, no signal levels grow without bound.

Thus, a Viterbi metric calculator can be built using peak detectors. For partial response signalling, the signal could exceed the (1) and (−1) signal levels and thus, a wrong threshold would be stored by the peak detectors. However, this problem is solved by gating the peak detectors to detect peaks at the proper time or in an analog implementation by using sample and holds (S/H) before the peak detectors. The S/H holds at the signal amplitude at the hold time when the signal is added at expected (1) or (−1) level. The peak detectors are then gated to peak detect only during the hold time. For partial response class IV, the S/H's are already required to demultiplex the interleaved class IV data stream.

The peak detectors in the present invention are implemented so that they can avoid the problem of probability growth without bound that other prior art Viterbi decoders have suffered. The peak detectors are able to avoid this problem since they store pulse peaks but are properly reset automatically. In this way, the Viterbi calculator of the present invention can compute the correct metric by only finding the highest peak. Previous peaks with smaller amplitudes are discarded.

Figure 4:
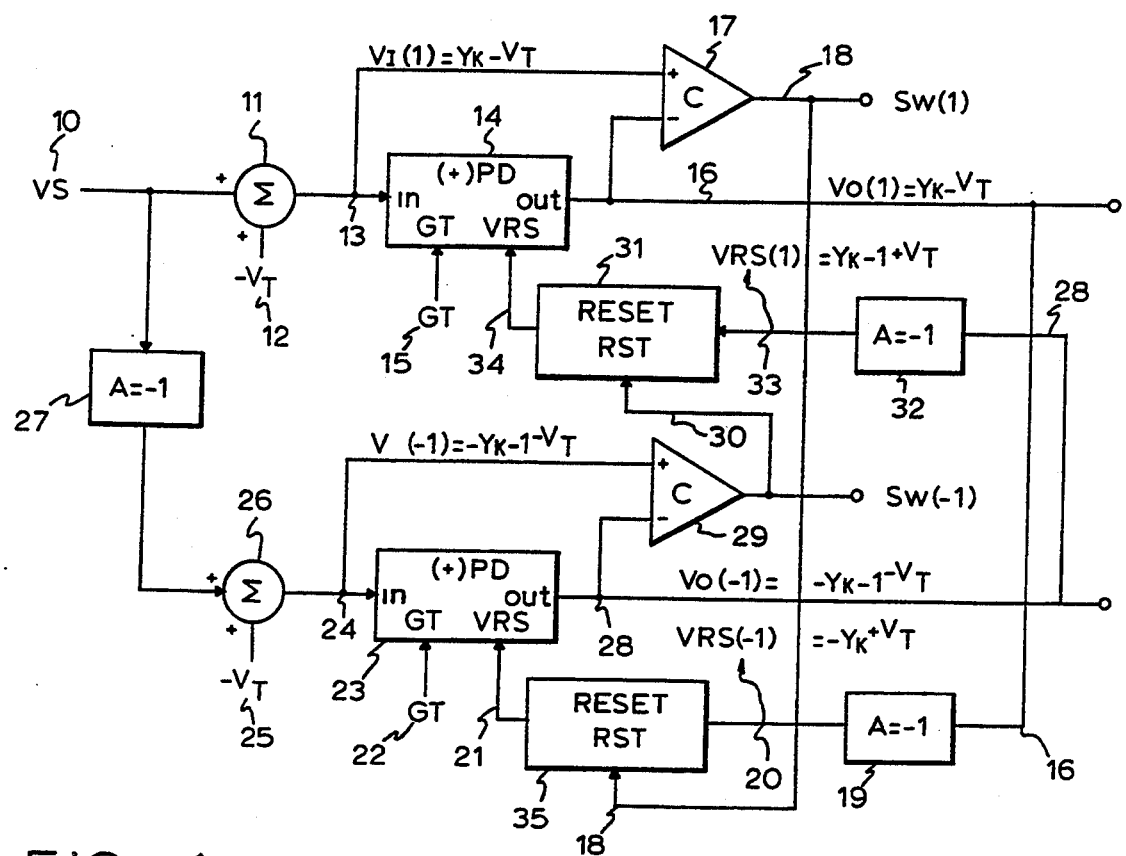
FIG. 4 is a block diagram illustrating the metric calculator of the present invention with $V_T$ subtracted from the inputs.
Figure 1:
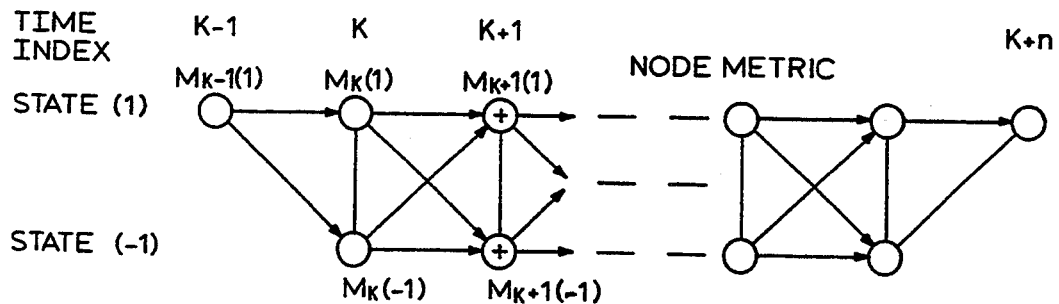
FIG. 1 is a diagram illustrating the 2-state trellis of the present invention.

Although both polarity peak detectors are used, a calculator implementation using (+) peak detectors only will be described. The metric calculator block diagram with $V_T$ subtracted from the inputs is shown in FIG. 4. In FIG. 4, the input signal $V_S$ 10 is inputted into adder 11 and also inputted into block 27 which has a gain of negative one. The negative of the threshold voltage, minus $V_T$ 12, is also input into adder 11. The output from adder 11 is VI (1) 13 which is equal to $Y_K - V_T$, and is inputted into the positive terminal of comparator 17 as well as inputted into the input terminal of peak detector 14. Gate signal 15 is also inputted into peak detector 14. Reset block 31 also outputs a signal 34 that is input into peak detector 14. The output of peak detector 14 V0 (1) 16 is equal to $Y_K - V_T$ and is inputted into the negative terminal of comparator 17 as well as being inputted into block 19 which has a gain of −1.

The output of comparator 17 is SW (1) 18 and this signal is inputted into the RST terminal of reset block 35. The output of negative gain block 19 VRS (−1) 20 is equal to $-Y_K + V_T$ and is also inputted into reset block 35. Output signal 21 of reset block 35 is inputted into the VIIS terminal of peak detector 23. The output signal from negative gain block 27, as well as negative threshold voltage signal $-V_T$ 25, are both inputted into positive adder 26. Output signal 24 from positive adder 26 is VI (−1) and is equal to $-Y_{K-1} - V_T$. Signal 24 is inputted into the positive terminal of comparator 29 as well as inputted into peak detector 23. Gate signal 22 is also inputted into peak detector 23. Output signal 28 from peak detector 23 is V0 (−1) and is equal to $-Y_{K-1} - V_T$.

Output signal 28 is inputted into negative terminal of comparator 29 as well as inputted into negative gain block 32 which has a gain of negative one. Output signal 30 SW (−1) of comparator 29 is inputted into the RST terminal of reset block 31. Output signal 33 VRS (1), which is equal to $Y_K - 1 + V_T$ from negative gain block 32, is inputted into reset block 31. Output signal 34 from reset block 31 is inputted into the VRS terminal of peak detector 14.

The peak detector of FIG. 4 exhibits the following behavior:

(A) When the input GT 15 is high, the circuit is gated on and the output of the peak detector stores and holds output voltage V0 16 which is equal to the highest (+) level VI 13, at its input terminal.

(B) When the reset control input 30 is high, V0 16 is reset to the reset voltage RS 34 and is stored and held. After reset and with GT 15 high, the circuit will store and hold VI 13 only if VI 13 is equal or greater than VRS 34.

From equation (8), the (−) pulse $Y_{K-1}$ is inverted and subtracted from $V_T$. A (+) peak detector output V0 (1) 16 is reset to VRS (1)=$Y_{K-1} - V_T$. For the (+) pulse, if VI (1) 13=$Y_K - V_T \geq V0(1)16 = Y_{K-1} - V_T$, a comparator output SW (1) 18 goes high and V0 (1)=VI (1) peak is stored. As shown by equation (9), $V_T$ can be translated from a (+) peak detector input to its output. Then, VRS (1)=$Y_{K-1} - 2V_T$ and VI (1)=$Y_K$. Similarly, from equations (18) and (19), the reset for the (−) pulse VRS (−1)=$-Y_K + V_T$ for detecting VI (−)=$-Y_{K-1} - V_T$ or VRS (−1)=$-Y_K + 2V_T$ for detecting VI (−1)=$-Y_{K-1}$. In a practical implementation, the reset value might have to be limited because of overloads caused by transients or large noise values. A comparator output SW (−1) 30 goes high and V0 (−1)28=VI(−1) 24 peak when VI (−1)$\geq$V0(−1). Note that notation $Y_{K-1}$ now is issued to define a (−) polarity pulse and $Y_K$ defines a (+) polarity pulse and that they do not define pulses occurring at a particular time.

Figure 5:
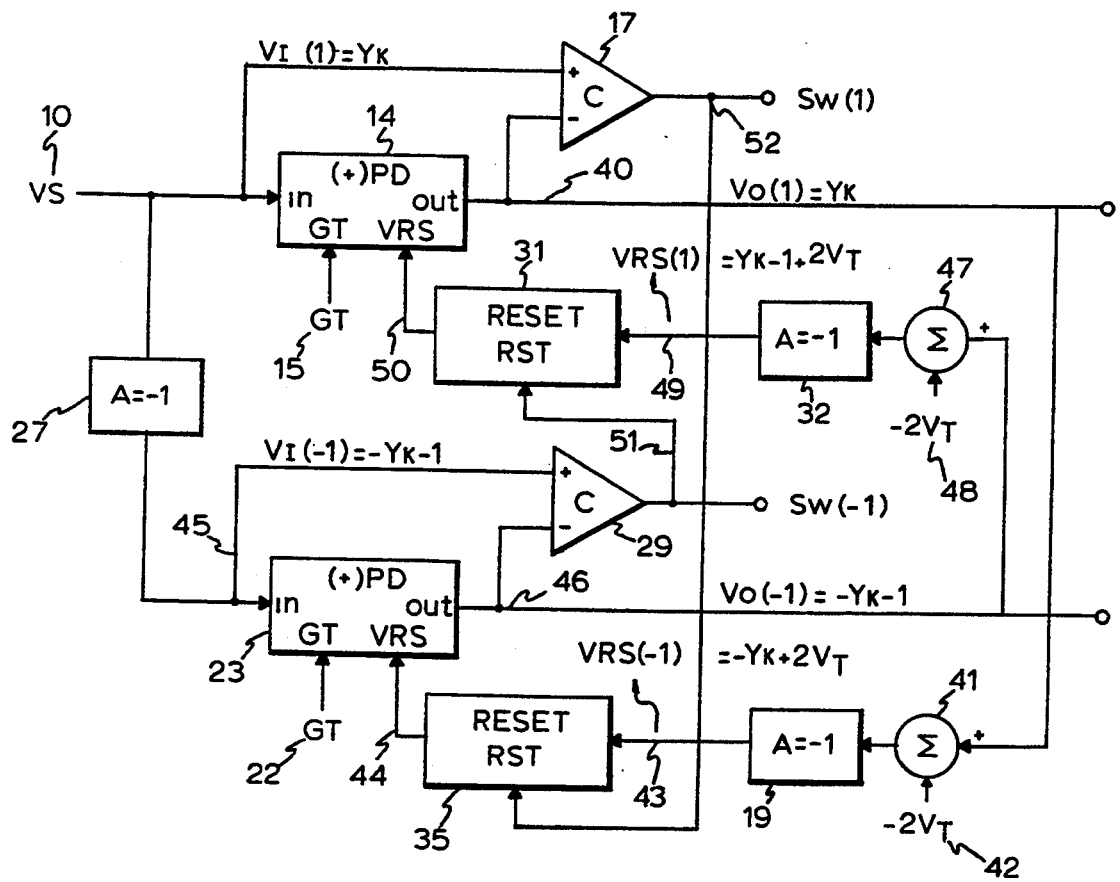
FIG. 5 is a block diagram illustrating the metric calculator of the present invention with $V_T$ translated to the outputs.

The metric calculator block diagram with $V_T$ translated to the outputs is shown in FIG. 5. Note that blocks 19, 27 and 32, which all have a gain of minus one, are not required in either FIGS. 4 or 5 in an analog implementation, if differential signalling with both polarity signals is used. In FIG. 5, input signal VS 10 is inputted directly into the input terminal of peak detector 14 as well as minus one gain block 27. Signal VS 10 is the same as VI(1)=$Y_K$ which is also inputted into the positive terminal of comparator 17. Gate signal 15, as well as output signal 50 from reset block 31 are also inputted into (+) peak detector 14. Output signal 40 V0 (1) from peak detector 14 is inputted into the negative terminal of comparator 17 as well as inputted into positive adder 41. Signal 42 $-2V_T$ is also inputted into positive adder 41. Output of adder 41 is inputted into −1 gain block 19.

Output signal 43 VRS (−1)=$-Y_K + 2V_T$ from block 19 is inputted into reset block 35. Output signals 52 SW (1) from comparator 17 is inputted into the RST terminal of reset block 35. Output signal 44 from reset block 35 is inputted into the VRS terminal of peak detector 23. Gate signal 22 is also inputted into peak detector 23. Output signal 45 VI (−1)=$-Y_{K-1}$ from −1 gain block 27 is inputted into the input terminal of peak detector 23 as well as inputted into the positive terminal of comparator 29.

Output signal 46 V0 (−1)=$-Y_{K-1}$ from peak detector 23 is also inputted into the negative terminal of comparator 29 as well as inputted into adder 47. Signal 48 $-2V_T$ is also inputted into adder 47. The output of adder 47 is inputted into $-1$ gain block 32. Output signal 49 from $-1$ gain block 32 VRS $(1)=Y_{K-1}+2V_T$ is inputted into reset block 31. Output signal 51 from comparator 29 SW $(-1)$ is inputted into the RST terminal of reset block 31. Output signal 50 from reset block 31 is inputted into VRS terminal of peak detector 14.

The metric calculator of FIG. 5 has many of the same properties as the metric calculator of FIG. 4, except that in FIG. 5, the value $V_T$ is translated to the outputs instead of being subtracted from the inputs. The SW (1) and SW $(-1)$ signals control the Viterbi survival sequence shift registers and also the resetting of the opposite polarity (+) peak detectors. V0 (1) is reset when SW $(-1)=$high and V0 $(-1)$ is reset when SW $(1)=$high. The SW (1) and SW $(-1)$ outputs could be latched to ease the timing requirements. An advantage of the metric calculator of FIG. 5 is that the $-1$ gain blocks and the adders can be performed by the same circuit.

Figure 6:
FIG. 6 illustrates signal waveforms that illustrate the corresponding output waveforms that result from a typical input waveform.

An example of a signal waveform is shown in FIG. 6. Signal $V_S$ is the analog input signal after amplification and filtering from the magnetic recording media. As can be seen from the timing diagrams, output signal SW (1) outputs positive pulses for every time interval that the input signal has a positive peak pulse greater than the pulse stored in the peak detector. Similarly, output signal SW $(-1)$ outputs a positive square pulse for every time the input signal has a negative pulse greater than the pulse stored in the peak detector.

Output signal $V_o(1)$ is the positive peak detected signal. When SW(1) is high, $V_o(1)$ is increased to a new higher value equal to $V_S(Y_K)$. When SW$(-1)$ is high, $V_o(1)$ is being reset to reset voltage VRS 50 $(Y_{K-1}+2V_T)$. During time intervals when neither SW(1) nor SW$(-1)$ is high, $V_o(1)$ does not change. Similarly, output signal $V_o(-1)$ shown in FIG. 6 is the negative peak detected signal from peak detector 23 of FIG. 5. When SW$(-1)$ is high, $V_o(-1)$ is increased in magnitude to a new higher value equal to the peak detector input voltage.

With the first positive pulse from example signal $V_S$ in FIG. 6, signal SW(1) outputs a positive pulse. Then the $V_S$ signal outputs a small negative signal causing SW $(-1)$ to output a pulse in this time interval. However, in the next time interval, a larger negative $V_S$ signal is detected, thus signifying that the previous, smaller negative signal was an error pulse, and the peak detector of FIG. 5 instead stores the new, larger negative pulse to be provided to the survivor sequence. When the next positive $V_S$ signal above the minimum threshold is detected, SW(1) outputs another pulse. The negative pulse in the earlier time interval had reset the peak detector receiving the positive signals. Thus, this second positive pulse, although smaller than the first positive pulse, is registered into the survivor sequence. The subsequent pulses illustrated for $V_S$ describe alternating states with alternating positive and negative signals.

When a very large negative pulse $(Y_{K-1})$ enters the metric calculator, then this value resets the reset voltage in peak detector 14 through reset block 31. The reset voltage is set to $Y_{K-1}+2V_T$ but since $Y_{K-1}$ is a large, negative value, the reset voltage level will be low. Therefore, if a positive $V_S$ pulse is detected in time interval K, $Y_K$ can be a low value and still be registered in the sequence. If $Y_{K-1}$ was a low value, then $Y_K$ would have to be higher for a transition to the (1) state to occur.

Figure 7:
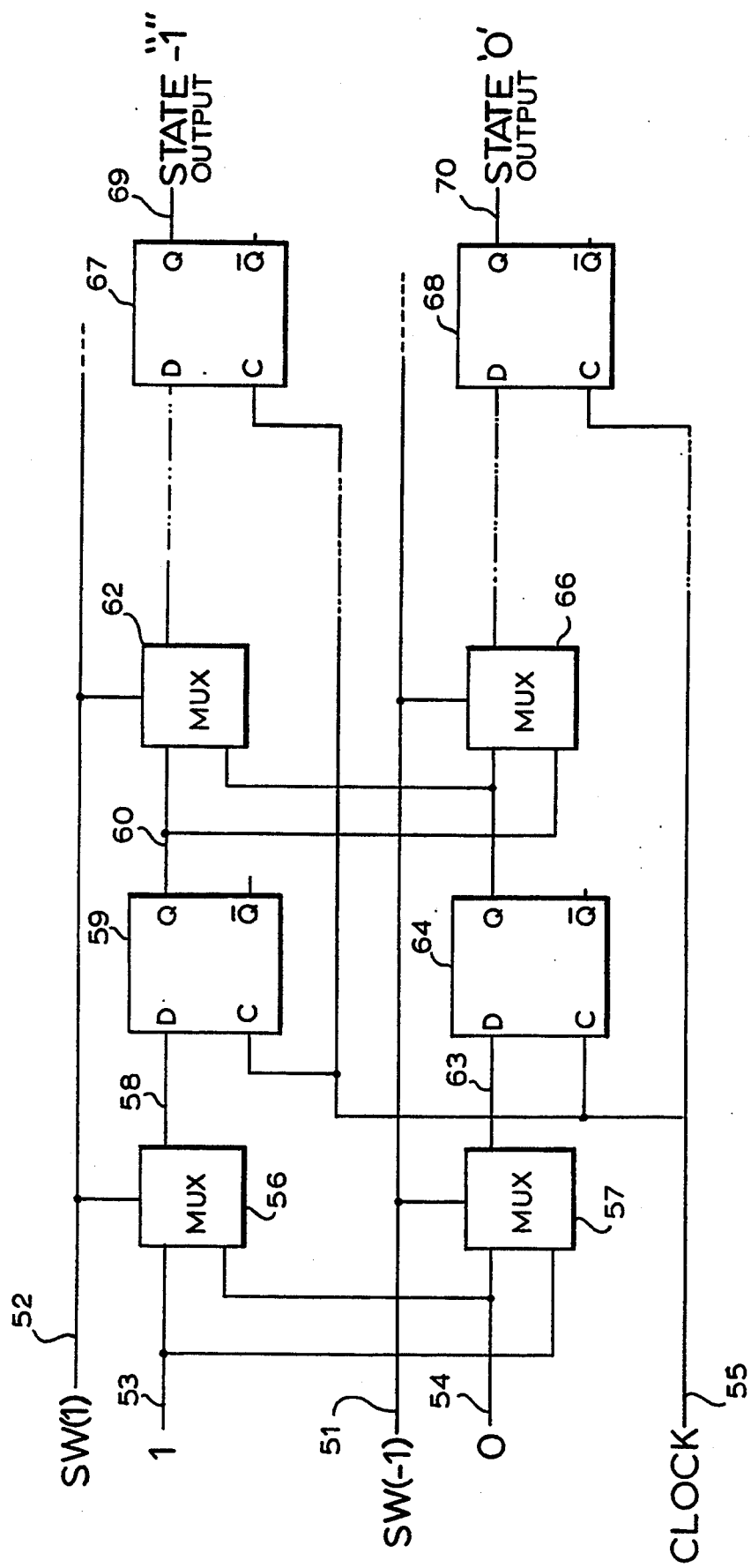
FIG. 7 is a block diagram illustrating the shift register sequence implemented with the present invention.

An example of the circuitry for storage and updating of the survivor sequences is illustrated in FIG. 7. The circuitry comprises two shift registers, each consisting of a series of alternating multiplexers and flip-flops coupled to each other. Output signal SW(1) 52 from the metric calculator diagram of FIG. 5 is coupled to the control input of the multiplexers of the first shift register, multiplexer 56 and multiplexer 62. Output signal SW$(-1)$ 51 from comparator 29 of FIG. 5 is coupled to the control inputs of the multiplexers of the second shift register of FIG. 7, multiplexer 57 and multiplexer 66. "1" bit signal 53 and "0" bit signal 54 are both coupled to multiplexers 56 and 57.

Output signal 58 from multiplexer 56 is inputted into flipflop 59 and output signal 60 from flipflop 59 is inputted into multiplexer 62. The output signal 60 is also inputted into multiplexer 66. Output signal 63 from multiplexer 57 is coupled to flipflop 64 and output signal 65 from flipflop 64 is coupled to multiplexer 66 as well as coupled to multiplexer 62. The output of multiplexer 62 is then coupled to a series of alternating flipflop and multiplexer blocks until the output 69 of the last flipflop 67 outputs the state "1" output. The output of multiplexer 66 is also coupled to a series of alternating flip-flop and multiplexer blocks until the output signal 70 of the last flipflop 68 outputs the state "0" output. Clock signal 55 is coupled to all of the flipflops of FIG. 7, including flipflops 59, 64, 67 and 68. Clock signal 55 is synchronized to signals SW(1) 52 and SW$(-1)$ 51.

During typical operation of FIG. 7, when neither SW(1) or SW$(-1)$ is high, the circuit is clocking '1' bits into the top shift register each period while also clocking '0' bits into the bottom shift register. If SW$(-1)$ then goes high in a following clock period, this signals the circuit that the value stored in the bottom register should be shifted into the top register. An example of this procedure could take place in FIG. 7 where output signal 65 from flip-flop 64 is coupled to the input of multiplexer 62 of the top register. The two shift registers are designed so that they store the incoming bits and can also correct bit values if needed. If a '1' bit had been sent down the shift register during a certain clock period but should have been a '0' bit, instead this shift register sequence can correct this error in a later clock period further down the shift register sequence. The output of the Viterbi detector is the output of either of these shift register path memories. If the shift register sequences are long enough, then their outputs will agree most of the time. This is because as soon as a correct bit of information is detected, this bit is shifted into the other register sequence as well. Therefore, the registers should be designed long enough so eventually if data is incorrectly provided, the two sequences will still end up containing the same information. The advantage of this shifting scheme is if there is a larger positive pulse immediately following a smaller positive pulse that had been registered, this sequence can adapt and ignore the smaller pulse and register the larger pulse.

Figure 8:
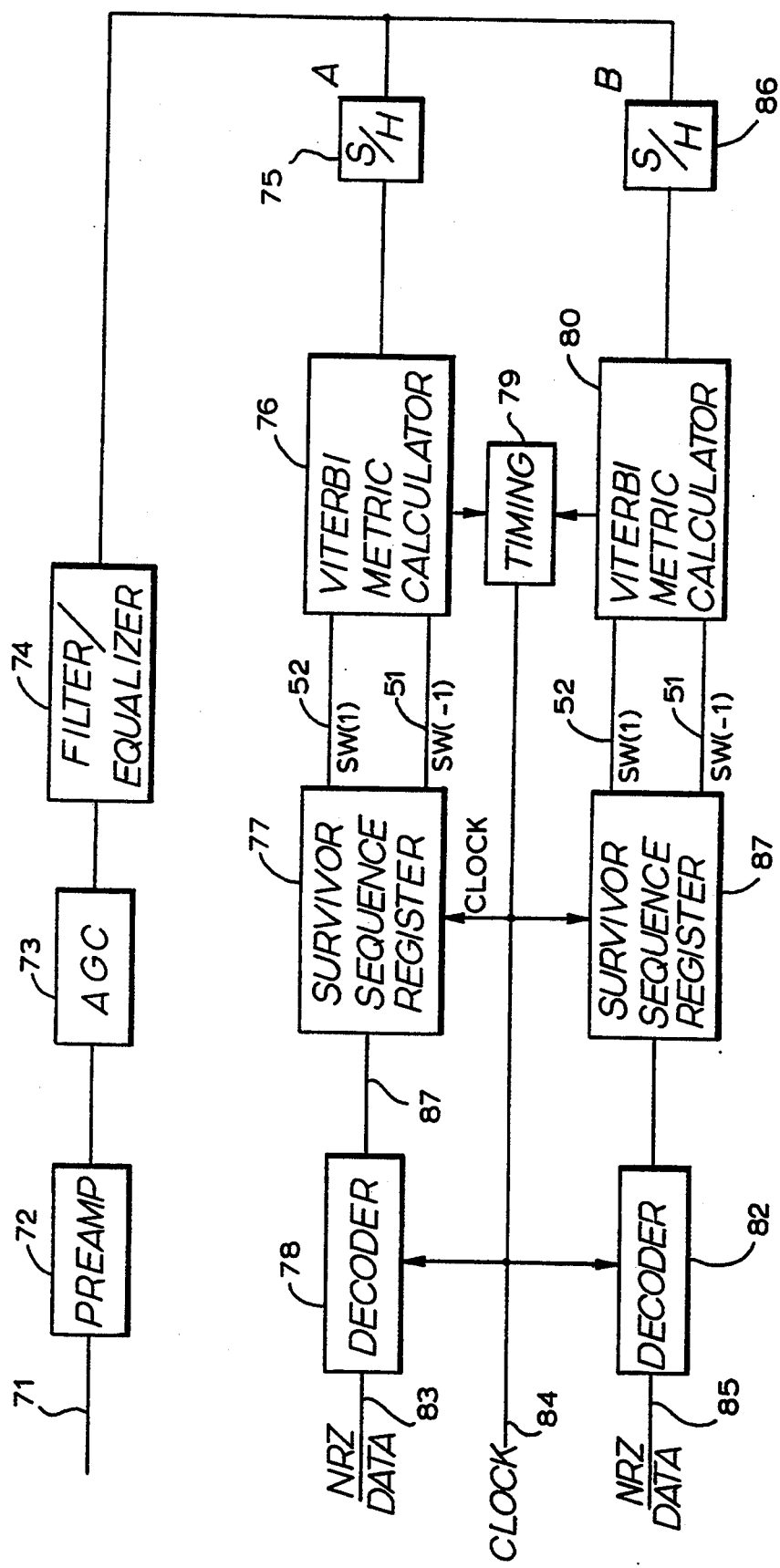
FIG. 8 is a block diagram illustrating the transmission system that the present invention finds application.

A schematic representation of a transmission system in which the present invention finds application is given in FIG. 8. The block diagram of FIG. 8 receives an input signal from a communication channel or recording device. Input signal 71 is provided to preamplifier 72 which is then coupled to automatic gain control (AGC) block 73. After being amplified, the output signal of AGC block 73 is provided to filter/equalizer block 74. The filter signal is a continuous signal which is provided to sample-and-hold (S/H) blocks A 75 and B 86. The S/H blocks A 75 and B 86 sample and hold the filter signal at the same rate but at alternate time intervals. The samples from S/H block 75 are provided to Viterbi calculator 76 as is detailed in FIGS. 4 and 5. As discussed before, Viterbi calculator 76 uses a maximum-likelihood sequence estimation (MLSE) process to obtain a two-state trellis. The Viterbi block 76 is coupled to timing means 79 and provides signals SW(1) 52 and SW(−1) 51 to survivor sequence register block 77. Block 77 is coupled to clock signal 84 provided by timing means 79 and block 77 updates the survivor sequences which allows final selection of the binary output values. The output of block 77 is provided to decoder 78 which transforms its received input to non-return to zero (NRZ) data 83. Decoder block 78 is also coupled to clock signal 84.

S/H block 86 provides samples to Viterbi calculator 80 which is coupled to timing means 79, and also provides another set of signals SW(1) 52 and SW(−1) 51 to survivor sequence register block 81. Block 81 is coupled to clock signal 84 and provides the survivor sequence to decoder block 82. Decoder block 82 is also coupled to dock signal 84 and provides NRZ data 85.

Figure 9:
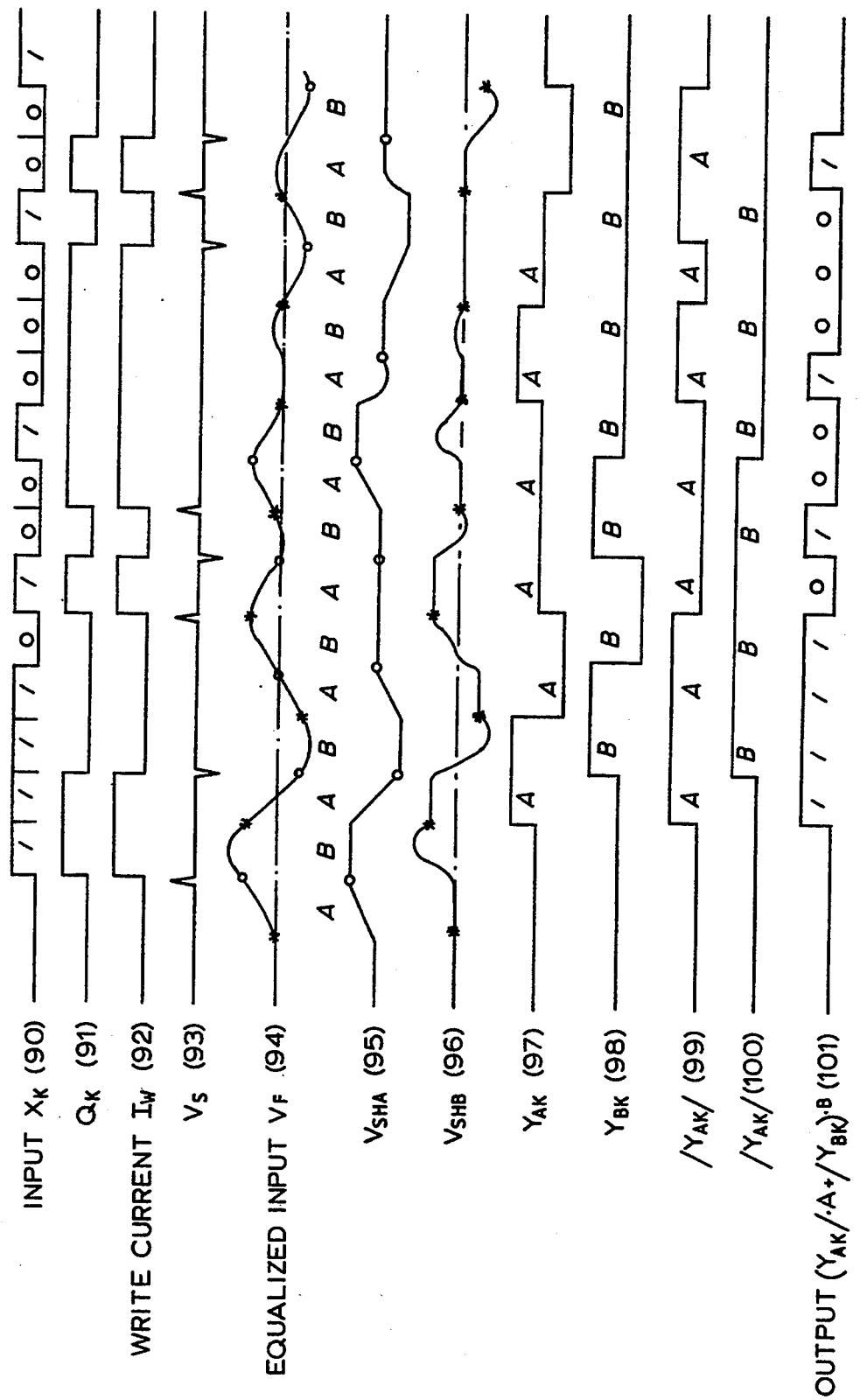
FIG. 9 is an illustration of timing diagrams used to determine the output signal of the metric calculator of the present invention.

FIG. 9 illustrates timing diagrams showing the sample and holding process of the input signal and how the Viterbi metric calculator is able to determine an output timing diagram based on the sample and holds. Input signal $X_K$ is the amplified, filtered signal provided to the metric calculator from a communication channel or recording device. Signal $X_K$ 90 is shown to be a series of docked bits of 1's and 0's. The output of signal $a_K$ 91 of FIG. 9 is dependent upon the incoming input signal $X_K$. Signal $a_K$ 91 is given by XOR function, $a_K = X_K \times a_K - 2$. This equation states that $a_K$ is the result of the input signal $X_K$ at time K exclusive-OR'ed with the value of signal 91 at a time K−2, $a_K-2$. By observation of signal 91 in FIG. 9, it can be seen that the timing diagram corresponds to this equation.

Write current $I_W$ 92 as shown in FIG. 9 follows the same binary timing pattern as signal $A_K-91$. Signal $V_S$ 93 illustrates the differentiation of the rising and falling edges that occur in write current signal 92. Signal 92 indicates which differentiations of write current 92 are positive and negative. Equalized input signal $V_F$ 94 is shown to be sampled at a constant period rate alternately by sample and hold block A 75 and then sample and hold block B 86, as described in FIG. 8.

The circles on timing diagram 94 indicate where the sample and hold A takes place and the "X marks" on the timing diagram 94 indicate where the sample and holds of B take place. Timing diagram $V_{SHA}$ 95 shows the resulting signal after sampling at the A points. From observations, it can be seen that during the B sample intervals, timing diagram 95 holds its amplitude constant until the next A sampling interval. The same is true for timing diagram 96 $V_{SHB}$ where the resulting signal reflects the B sampling intervals of timing diagram 94 and where timing diagram 96 has constant amplitude during the A sampling intervals.

Timing diagram 97 $Y_{AK}$ is the output of sample and hold block 75 A and is a 3-state signal where the signal has been held and delayed for one clock period compared to timing diagram 95 $V_{SHA}$. The delayed output $Y_{AK}$ converts the sample signal $V_{SHA}$ into a digital format. The delayed output of S/H block B 86 is shown as timing diagram 98 $Y_{BK}$ which reflects in digital form a one clock period delayed output signal of timing diagram 96 $V_{SHB}$.

Timing diagrams 99 ($Y_{AK}$) and 100 ($Y_{BK}$) are the absolute value equivalent timing diagrams of timing diagrams 97 and 98, respectively. The resulting output signal 101 is also illustrated and it can be seen that output signal 101 is the same as input signal 90, except for that output signal 101 is delayed by one full clock period. This output signal is determined by the equation $(Y_{AK}) \cdot A + (Y_{BK}) \cdot B$. The equation for the output signal states that if ($Y_{AK}$) is high during an A sampling interval, and/or if ($Y_{BK}$) is high during a B sampling period, then output signal 101 will be high during that particular interval. If neither of these cases are satisfied, then output signal 101 remains low. From observation, it can be seen that the output signal 101 shown in FIG. 9 follows this pattern.

Thus, a Viterbi detector using peak detectors and having a simple solution to the metric growth problem is described.

I claim:

1. An apparatus for a maximum likelihood sequence metric calculator used in decoding sampled values from a communication channel or recording device comprising:

a first adding means having as inputs a sampled input signal and the negative of a threshold voltage;

a first peak detecting means coupled to said first adding means providing a first output signal;

a first comparing means coupled to said first adding means and said first peak detecting means for providing a second output signal;

a first inverting means coupled to said first peak detector for providing a third output signal;

a first resetting means coupled to said first inverting means and said first comparing means for providing a reset signal output;

a second inverting means coupled to said sampled input signal;

a second adding means coupled to said second inverting means and also coupled to the said negative of the threshold value;

a second peak detecting means coupled to said second adding means and said first resetting means for providing a fourth output signal;

a second comparing means coupled to said second adding means and to said second peak detecting means for providing a fifth output signal;

a third inverting means coupled to said second peak detecting means for providing a sixth output signal;

a second resetting means coupled to said third inverting means and to said second comparing means for providing a reset output signal to said first peak detecting means.

2. The apparatus of claim 1 wherein said first, second and third inverting means are amplifiers with gain of negative one.

3. An apparatus for a maximum likelihood sequence metric calculator used in decoding samples values from a communication channel or recording device comprising:

a first peak detecting means receiving a sampled input signal for providing a first output signal;

a first comparing means coupled to said sampled input signal and also coupled to said first peak detecting means for providing a second output signal;

a first adding means coupled to said first peak detecting means and also coupled to the negative of twice a threshold voltage signal;

a first inverting means coupled to said first adding means for providing a third output signal;

a first resetting means coupled to said first inverting means and also coupled to said first comparing means for providing a reset output signal;

a second inverting means coupled to said sampled input signal;

a second peak detecting means coupled to said second inverting means and also coupled to said first resetting means for providing a fourth output signal;

a second comparing means coupled to said second inverting means and also coupled to said second peak detecting means for providing a fifth output signal;

a second adding means coupled to said second peak detecting means and also coupled to the negative of twice the threshold voltage signal;

a third inverting means coupled to said adding means for providing a sixth output signal;

a second resetting means coupled to said third inverting means and to said second comparing means for providing a reset output signal to said first peak detecting means.

4. The apparatus of claim 3 wherein said first, second and third inverting means are amplifiers with gains of negative one.

5. The apparatus of claim 3 wherein either said second output signal or said fifth output signal goes high indicates a state change.

6. An apparatus for maximum-likelihood sequence decoding of sample sequences with intersymbol interference from a communication channel or recording device comprising:

a first peak detecting means for comparing and storing the largest amplitude positive pulse received from said sampled sequence;

a first resetting means coupled to said first peak detecting means for resetting voltage value stored in said first peak detecting means after a negative transition pulse has been received;

a first comparing means coupled to an input and an output of said first peak detecting means and providing a first flag signal indicating whether a larger positive peak has been detected;

a second peak detecting means for comparing and storing the largest amplitude negative pulse received from said sampled sequence;

a second resetting means coupled to said second peak detecting means and receiving said first flag signal for resetting voltage value stored in said second peak detecting means;

a second comparing means coupled to an input and an output of said second peak detecting means and an output of said second comparing means being coupled to said first resetting means for providing a second flag signal to said first resetting means indicating whether a larger negative peak has been detected;

a survivor sequence register scheme receiving said first and second flag signals for providing the maximum-likelihood sequence.

7. The apparatus of claim 6 wherein said survivor sequence register scheme comprises:

a first shift register for receiving said first flag signal comprising a first set of multiplexers having each multiplexer coupled alternately to flip-flops in a serial fashion;

a second shift register for receiving said second flag signal comprising a second set of multiplexers having each multiplexer coupled alternately to flip-flops in a serial fashion, the outputs of said flipflops being coupled to the inputs of first set of multiplexers as well, the outputs of said flip-flops of said first register also coupled to the inputs of said second set of multiplexers.

8. A method of decoding a stream of received data having two states with intersymbol interference from a communication channel or recording device, the method comprising the steps of:

computing a metric for each sample pulse received;

comparing the most recent sampled positive or negative amplitude to previous stored sampled amplitude of same positive or negative amplitude;

resetting an amplitude stored for the opposite polarity every time the latest peak of a plurality of consecutive peaks has a greater amplitude;

generating flag signals during resetting operation to indicate a transition in state, said flag signals are stored and later corrected, if needed, to attain a most likely correct bit sequence corresponding to the decoded stream of data.

* * * * *